United States Patent
Rho et al.

(10) Patent No.: US 8,158,966 B2
(45) Date of Patent: Apr. 17, 2012

(54) PHASE CHANGE MEMORY DEVICE HAVING PROTECTIVE LAYER AND METHOD FOR MANUFACTURING THE SAME

(75) Inventors: Dae-Ho Rho, Ichon (KR); In-Cheol Ryu, Ichon (KR); Hyun-Seok Kang, Ichon (KR)

(73) Assignee: Hynix Semiconductor, Inc. (KP)

( * ) Notice: Subject to any disclaimer, the term of this patent is extended or adjusted under 35 U.S.C. 154(b) by 801 days.

(21) Appl. No.: 12/246,286

(22) Filed: Oct. 6, 2008

(65) Prior Publication Data

US 2009/0321708 A1  Dec. 31, 2009

(30) Foreign Application Priority Data

Jun. 30, 2008  (KR) .................. 10-2008-0062608

(51) Int. Cl.
 *H01L 45/00* (2006.01)
(52) U.S. Cl. .......................................................... 257/4
(58) Field of Classification Search .................. 257/2–5, 257/368, 538, 616, E27.004, E47.001, E21.495, 257/E21.487, E21.294; 438/95, 96, 382, 102, 783; 365/100, 148, 158
See application file for complete search history.

(56) References Cited

U.S. PATENT DOCUMENTS

2006/0163554 A1* 7/2006 Lankhorst et al. ............... 257/4
2009/0050871 A1* 2/2009 Matsui ............................. 257/2

FOREIGN PATENT DOCUMENTS

| KR | 1019970053528 |   | 7/1997 |
| KR | 1019980059915 | A | 10/1998 |
| KR | 1019980059950 |   | 10/1998 |
| KR | 1020040043372 |   | 5/2004 |

* cited by examiner

*Primary Examiner* — Dao H Nguyen
*Assistant Examiner* — Tram H Nguyen
(74) *Attorney, Agent, or Firm* — Baker & McKenzie LLP

(57) ABSTRACT

A phase change memory device includes a plurality of phase change structures, each with a phase change material layer, disposed on a semiconductor substrate, a first protective layer formed to cover surfaces of the plurality of phase change structures, an atom adsorption enhancement layer formed on a surface of the first protective layer, and a second protective layer formed on a surface of the atom adsorption enhancement layer.

40 Claims, 4 Drawing Sheets

PHASE CHANGE MEMORY DEVICE HAVING PROTECTIVE LAYER AND METHOD FOR MANUFACTURING THE SAME

CROSS-REFERENCES TO RELATED APPLICATION

The present application claims priority under 35 U.S.C. §119(a) to Korean Patent Application No. 10-2008-0062608, filed in the Korean Intellectual Property Office on Jun. 30, 2008, which is incorporated herein by reference in its entirety as if set forth in full.

BACKGROUND

1. Technical Field

The embodiments described herein relate to a phase change memory device, and more particularly, to a phase change memory device having a protective layer and a method for manufacturing the same.

2. Related Art

Generally, a phase change memory device is a memory device that writes and reads information by changing a phase of a phase change material from an amorphous state, which has a high resistance, to a crystalline state, which has a low resistance. The phase change memory device is advantageous over a flash memory device in that it has a fast operational speed and a high-level integration. A representative phase change material includes a chalcogenide compound that is commonly made of germanium (Ge), antimony (Sb), and tellurium (Te) constituents, which are collectively referred to as a GST chalcogenide.

Since the phase changes continuously occur from the crystalline state to the amorphous state and vice versa, the repeated volumetric expansion and contraction of the phase change material generates heat, wherein the phase change material is likely to delaminate from bottom electrode contacts (BECs). In addition, since the phase change material is formed using the composite compound described above, the constituents of the phase change material are likely to diffuse through adjacent layers during fabrication processing.

In order to prevent or avoid the delamination of the phase change material from the bottom electrode contacts and to prevent the diffusion of the constituents of the phase change material, a protective layer can be formed as an encapsulator so as to prevent degradation of the properties of the phase change material during the phase changing. For example, a silicon oxide layer and a silicon nitride layer can be used as the protective layer.

When the protective layer is formed of a silicon oxide layer, can be difficult to prevent the diffusion of the constituents of the phase change material into the protective layer, and the silicon oxide layer may be recombined with the diffusing constituents to create an interface having abnormal composition. This abnormal composition interface can adversely influence the operational characteristics of the phase change material and can actually facilitate the diffusion of the constituents of the phase change material to further degrade the properties of the phase change material.

Meanwhile, when the protective layer is formed of a silicon nitride layer, since the silicon nitride layer is formed at a substantially high temperature over 400° C., a thermal burden can be imposed on the phase change material.

In addition, because the silicon nitride layer has poor step coverage characteristics, it cannot be sufficiently deposited to a substantially uniform thickness on the sidewalls of a phase change material layer. As a consequence, the silicon nitride layer can be formed in the shape of relatively thick overhangs on the upper edges of the phase change material layer, and can be formed to have relatively thin portions on lower portions of sidewalls of the phase change material layer.

Accordingly, the presence of the overhangs makes it difficult to properly fill spaces formed between adjacent phase change material layers using a buried insulating layer. Furthermore, when forming the buried insulating layer using a high density plasma oxide layer, the relatively thin portions of the silicon nitride layer are likely to be damaged by the applied plasma used for forming the high density plasma oxide layer. Thus, corresponding portions of the phase change material can become exposed, thereby changing the properties of the phase change material and adversely influencing the driving of the phase change memory device.

SUMMARY

A phase change memory device having a protective layer and a method for manufacturing the same are described herein.

In one aspect, a phase change memory device includes a plurality of phase change structures, each with a phase change material layer, disposed on a semiconductor substrate, a first protective layer formed to cover surfaces of the plurality of phase change structures, an atom adsorption enhancement layer formed on a surface of the first protective layer, and a second protective layer formed on a surface of the atom adsorption enhancement layer.

In another aspect, a method for manufacturing a phase change memory device includes forming a plurality of phase change structures, each including a phase change material layer, on a semiconductor substrate, forming a first protective layer on the semiconductor substrate including the plurality of phase change structures, forming an atom adsorption enhancement layer on the first protective layer, and forming a second protective layer on the atom adsorption enhancement layer to form a plurality of protective structures.

In another aspect, a method for manufacturing a phase change memory device includes forming a plurality of phase change structures, each including a phase change material layer, on a semiconductor substrate, depositing a silicon nitride layer at a temperature between about room temperature and about a phase change temperature of the phase change material layer, on the semiconductor substrate including the plurality of phase change structures, forming a dangling bond layer by plasma-treatment of a surface of the silicon nitride layer, and depositing a silicon oxide layer on the dangling bond layer to form a plurality of protective structures.

These and other features, aspects, and embodiments are described below.

BRIEF DESCRIPTION OF THE DRAWINGS

Features, aspects, and embodiments are described in conjunction with the attached drawings, in which.

DETAILED DESCRIPTION

Figure 1:
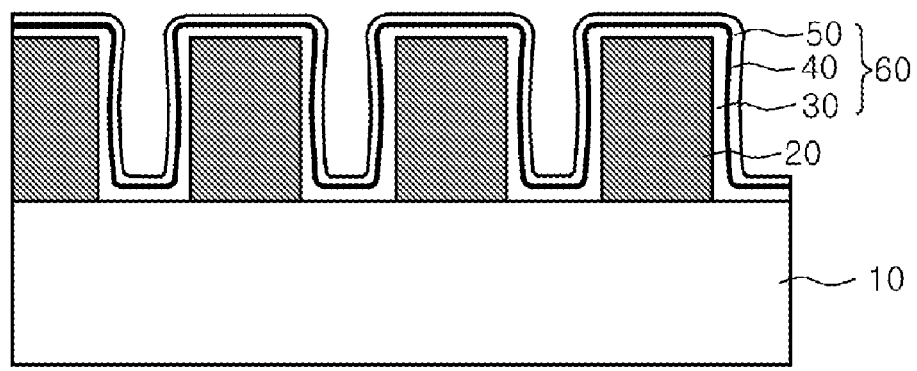
FIG. 1 is a cross sectional view of an exemplary phase change memory device according to one embodiment.
Figure 2:
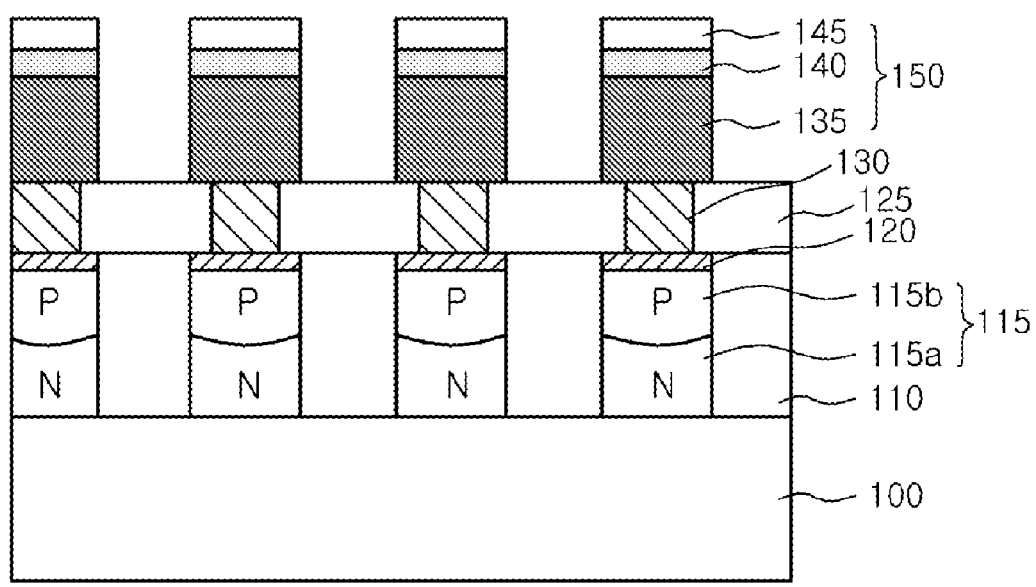
FIGS. 2-5 are cross sectional views of an exemplary method for manufacturing a phase change memory device according to another embodiment.

FIG. 1 is a cross sectional view of an exemplary phase change memory device according to one embodiment. Referring to FIG. 1, a phase change memory device can include a plurality of phase change patterns 20 that can be formed on a semiconductor substrate 10. The phase change patterns 20 can be configured at regular intervals along a surface of the semiconductor substrate 10. For example, the phase change patterns 20 can be located in a one-to-one correspondence with memory cells.

A plurality of protective structures 60 can be formed on surfaces of the phase change patterns 20 and on the surface of the semiconductor substrate 10 between the phase change patterns 20. For example, the protective structures 60 can function to prevent delamination of the phase change patterns 20 from electrodes, as detailed below, and to prevent diffusion of constituent materials of the phase change patterns 20.

In one embodiment, the protective structures 60 can include a first protective layer 30, an adsorption enhancement layer 40, and a second protective layer 50, wherein the first protective layer 30 can have reaction resistance to the phase change patterns 20. The first protective layer 30 can include an insulating layer formed at a relatively low temperature, and can have a thickness greater than the second protective layer 50. For example, the first protective layer 30 can include a silicon nitride layer. The adsorption enhancement layer 40 can be a dangling bond layer formed on the surface of the first protective layer 30 to promote deposition of the second protective layer 50. The second protective layer 50 can be formed on the adsorption enhancement layer 40 using the same or different material(s) as/or from the first protective layer 30. Preferably, the second protective layer 50 can include an insulating layer that has better step coverage and reactivity characteristics as compared to those of the first protective layer 30, for example, a silicon oxide layer. Even though the silicon oxide layer can be used as the second protective layer 50, since the phase change patterns 20 are already encapsulated by the first protective layer 30, substantial reactions between the silicon oxide layer and the phase change patterns 20 does not occur.

In the exemplary configuration described above, in order to form the first protective layer 30 to directly cover the surfaces of the phase change patterns 20, a material formed at a relatively low temperature and having a relatively low reactivity with the phase change patterns 20 can be employed. Accordingly, it is possible to prevent a thermal burden from being imposed on the phase change patterns 20, thereby preventing changes to properties of the phase change patterns 20 due to repeated phase changing. In addition, since the first protective layer 30 is configured to not substantially react with the phase change patterns 20, functional characteristics of the phase change patterns 20 can be maintained.

As the adsorption enhancement layer 40 is formed on the first protective layer 30 to function as a dangling bond layer, the subsequent deposition of the second protective layer 50 is promoted and the second protective layer 50 can be formed over the first protective layer 30 to be substantial uniform and relatively thin. For example, since the second protective layer 50 can comprise a material or materials having excellent step coverage characteristics, as compared to the first protective layer 30, the step coverage characteristics of the entire protective structures 60 can be improved.

FIGS. 2-5 are cross sectional views of an exemplary method for manufacturing a phase change memory device according to another embodiment. First, referring to FIG. 2, a first interlayer dielectric 110 having a plurality of switching elements can be formed on a surface of a semiconductor substrate 100. The semiconductor substrate 100 can comprise a silicon substrate configured to include a plurality of junction areas that can be driven using conductive lines, such as word lines. For example, each of the junction areas can be heavily doped N-type impurity areas. In addition, the switching elements can be PN diodes 115, for example. Here, each PN diode 115 can be composed of an N-type selective epitaxial growth (SEG) layer 115a and a P-type SEG layer 115b, for example.

A second interlayer dielectric 125 having bottom electrode contacts 130 formed therein can be formed on the first interlayer dielectric 110 having the PN diodes 115 formed therein. The bottom electrode contacts 130 can be configured in a one-to-one correspondence to the PN diodes 115. In addition, an ohmic contact layer 120 can be interposed between each of the bottom electrode contacts 130 and a corresponding one of the PN diodes 115. The bottom electrode contacts 130 can be formed of a conductive material or materials which have a relatively large sheet resistance. For example, the bottom electrode contacts 130 can include a titanium nitride (TiN) layer, a polysilicon (poly-Si) layer, or a silicon-germanium (SiGe) layer. The ohmic contact layer 120 can be formed of a metal silicide material or materials. The second interlayer dielectric 125 can include a silicon nitride (SiN) layer having excellent heat insulating characteristics for preventing heat transfer between the bottom electrode contacts 130 formed within the second interlayer dielectric 125.

A plurality of phase change structures 150 can be formed by sequentially depositing a phase change material layer 135, a conductive layer 140, which can function as top electrodes, and a hard mask layer 145 on the second interlayer dielectric 125. Then, by etching predetermined portions of the hard mask layer 145, the conductive layer 140 and the phase change material layer 135 can be etched using photolithographic processes, for example. Accordingly, the phase change structures 150 can be formed in a one-to-one correspondence with the bottom electrode contacts 130.

Figure 3:
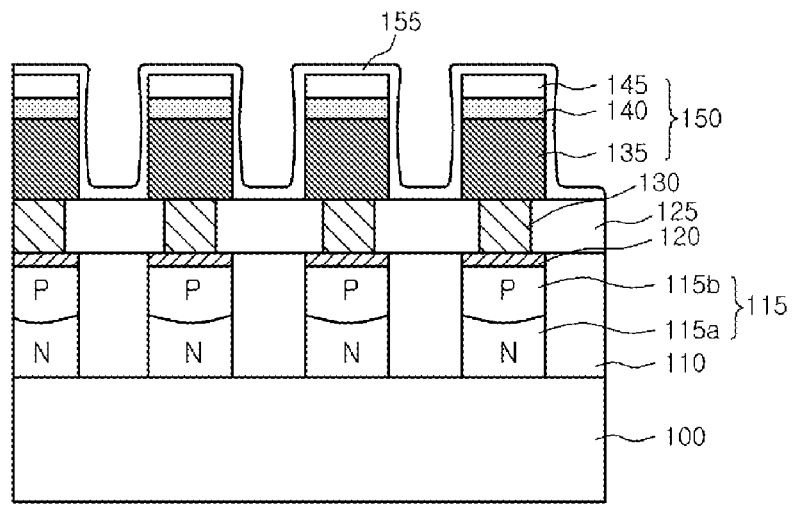

In FIG. 3, a first protective layer 155 can be formed on the second interlayer dielectric 125 to encapsulate the phase change structures 150. The first protective layer 155 can be formed of a material or materials that do not substantially react with the material(s) used to form the phase change structures 150, specifically, the phase change material layer 135. Moreover, the first protective layer 155 can be deposited at a temperature below about the phase change temperature of the phase change material layer 135. The first protective layer 155 can include a relatively low temperature silicon nitride layer, i.e., a nitride layer that can be deposited within a temperature range between about room temperature and about the phase change temperature of the phase change material layer 135. When the phase change material layer 135 is formed of a GST chalcogenide, the silicon nitride layer can be deposited within a temperature range between about 20° C. and about 500° C. Here, the low temperature silicon nitride layer can be formed using low temperature chemical vapor deposition (CVD), spin coating, atomic layer deposition (ALD), or plasma enhanced chemical vapor deposition (PECVD), for example.

When the first protective layer 155 is deposited using PECVD, the magnitude of the RF power can be reduced during the deposition process to decrease plasma generation in order to reduce causing damage to the phase change material layer 135 by the plasma. For example, the first protective layer 155 can be formed by application of an RF power within a range of about 200 to about 300 Watts so that the amount and acceleration of the generated plasma ions can be decreased, thereby reducing the risk of plasma damage to the phase change material layer 135 during the formation of the first protective layer 155.

The first protective layer 155 can be formed to have a thickness less than a thickness commonly prescribed for a general phase change protection layer. For example, the first protective layer 155 can be formed to have a thickness corresponding to about one-half to about two-thirds of common thickness prescribed for a general phase change protection layer. In the one embodiment, the first protective layer 155 can be formed to have a thickness within a range of about 200 Å to about 600 Å. Due to the characteristics of the silicon nitride layer, the first protective layer 155 can be formed to be thicker at locations adjacent to the upper edges of the phase change structures 150 than along the sidewalls of the phase change structures 150, or to form overhangs on the uppers edges of the phase change structures 150. However, in the one embodiment, since the thickness of the first protective layer 155 is less than a thickness of an entire protective layer, the thickness of overhangs can be reduced and the step coverage can be improved.

Figure 4:
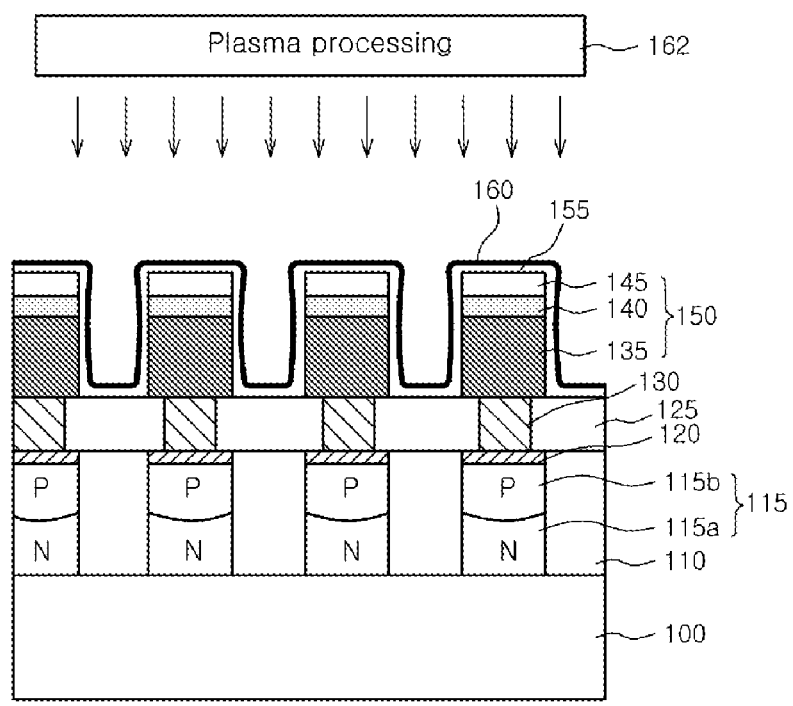

In FIG. 4, the surface of the first protective layer 155 can be treated, such as by a plasma treatment 162, to form an adsorption enhancement layer 160 on the surface of the first protective layer 155. For example, after loading the semiconductor substrate 100 into a plasma processing chamber, the plasma treatment 162 can be conducted to expose the semiconductor substrate 100 to a plasma for a preset plasma treatment time. In the one embodiment, the adsorption enhancement layer 160 can include a dangling bond layer composed of bonds with which atoms do not combine. The density of the dangling bonds of the dangling bond layer can be determined by the plasma treatment time. While it is preferred that the plasma treatment 162 for forming the adsorption enhancement layer 160 be conducted until a sufficient density amount of dangling bonds is created, the plasma treatment 162 should be conducted for a treatment time period within which the compositions of the first protective layer 155 and the phase change material layer 135 do not significantly change.

When the first protective layer 155 is formed using PECVD, the plasma treatment 162 can be conducted in-situ within the same chamber used for forming the first protective layer 155. Preferably, the plasma treatment 162 be conducted when a preset time elapses after the first protective layer 155 is formed in order to reduce the probability of damaging the treated surface of the first protective layer 155 due to continuous plasma processing.

When the first protective layer 155 includes the silicon nitride layer, the adsorption enhancement layer 160, which is obtained through the plasma treatment 162, can have a nitrogen-rich amorphous state. Because the adsorption enhancement layer 160 forms the dangling bonds on the surface of the first protective layer 155 by the plasma treatment 162, the adsorption enhancement layer 160 can be uniformly formed on the entire surface of the first protective layer 155 irrespective of the surface condition of the first protective layer 155. At this time, the plasma treatment 162 can be conducted under one of a nitrogen ($N_2$) gas atmosphere, an ammonia ($NH_3$) gas atmosphere, or a nitrogen/ammonia gas atmosphere, for example.

Figure 5:
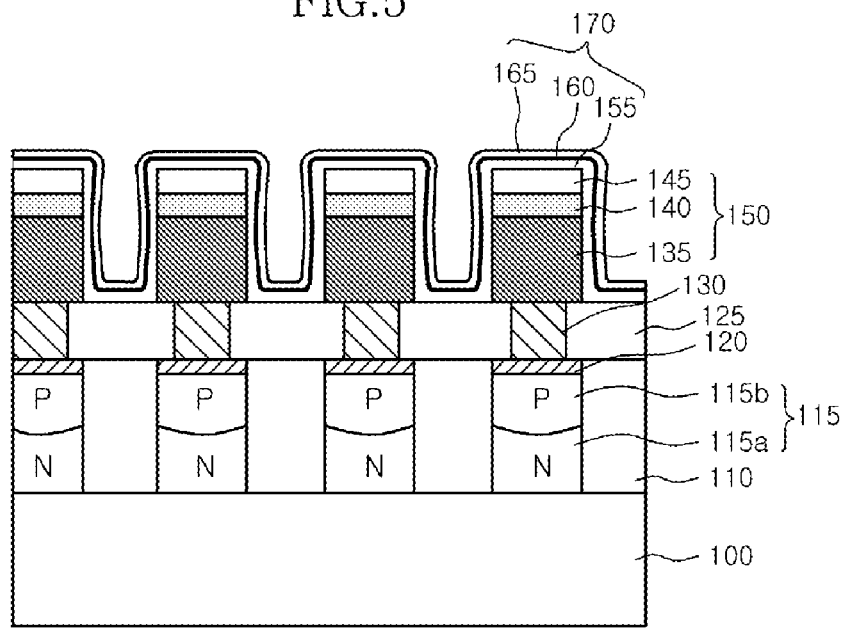

In FIG. 5, a second protective layer 165 can be formed on the adsorption enhancement layer 160 using the same or a different material or materials as/or from the first protective layer 155. The second protective layer 165 can be formed of a material or materials that have excellent step coverage and reactivity characteristics compared to the first protective layer 155. By forming the second protective layer 165 to have excellent reactivity after the adsorption enhancement layer 160 is formed, reaction between the dangling bonds of the adsorption enhancement layer 160 and the atoms constituting the second protective layer 165 can be activated, and the second protective layer 165 can be formed to a substantially uniform thickness on the entire surface of the adsorption enhancement layer 160. Since the adsorption enhancement layer 160 can be formed having a substantially uniform thickness even on portions of the first protective layer 155 where the plasma deposition may be relatively poorly due to the presence of surface undulations on the phase change structures 150, the second protective layer 165 can be deposited have a substantially uniform thickness even over those portions of the first protective layer 155 corresponding to the surface undulations. Moreover, since the phase change structures 150 can be primarily covered by the first protective layer 155, other substantial material(s) having excellent step coverage and reactivity characteristics can be used to form the second protective layer 165, thereby obviating the need of considering the reactivity with the phase change material layer 135.

In the one embodiment, the second protective layer 165 can include a silicon oxide layer, wherein the deposition of the second protective layer 165 completes formation of protective structures 170. The second protective layer 165 can be formed at a temperature less than about the phase change temperature of the phase change material layer 135 through various ways, such as chemical vapor deposition (CVD), ALD, and PECVD. When the second protective layer 165 is formed using PECVD, the phase change material layer 135 can be protected from plasma attack since the phase change material layer 135 is covered by the first protective layer 155. The second protective layer 165 can be formed to be relatively thin compared to a thickness of the first protective layer 155. Since the first protective layer 155 of the one embodiment can be formed to have a thickness less than a thickness of the entire protective layer, i.e., the protective structures 170, the first protective layer 155 can be deposited with improved step coverage, thereby alleviating the problems caused due to overhangs. Furthermore, because the second protective layer 165 can be uniformly deposited due to the presence of the adsorption enhancement layer 160 formed on the first protective layer 155, the step coverage characteristics of the protective structures 170 can be improved.

When depositing the second protective layer 165 using PECVD, the RF power applied to the plasma chamber can be increased within a range of about 10% to about 30%, so that the applied RF power can be within a range of about 500 to about 650 Watts. Accordingly, adsorption of the constituents of the second protective layer 165 can be promoted on lower surface portions of the semiconductor substrate 100 and along adjacent lower sidewalls of the phase change structures 150. Since the second protective layer 165 can be deposited having a relatively large thickness on the lower portions of the sidewalls of the phase change structures 150 upon which the first protective layer 155 is deposited relatively thin, the thickness of the entire protective structures 170 can be made substantially uniform.

Figure 6:
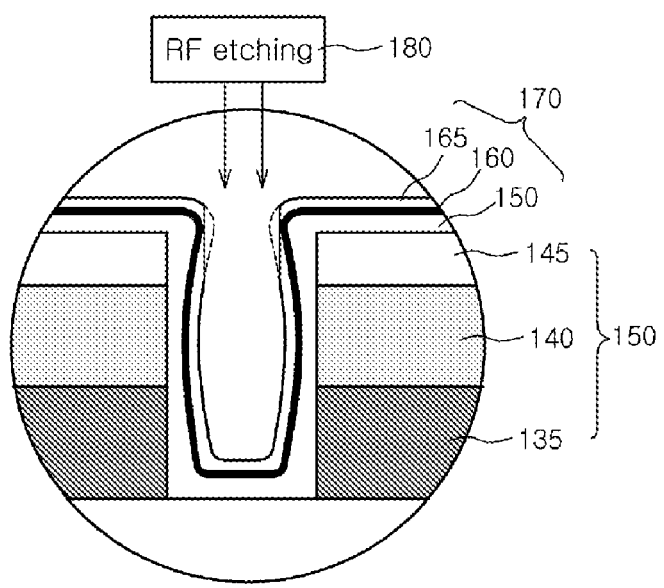
FIG. 6 is an enlarged cross sectional view of another exemplary method for manufacturing a phase change memory device according to another embodiment.

Further, as shown in FIG. 6, in the event that overhangs are formed on the upper edges of the protective structures 170, the overhangs can be removed through RF etching 180. In FIG. 6, the dotted lines indicate the overhangs that are removed by the RF etching 180.

Figure 7:
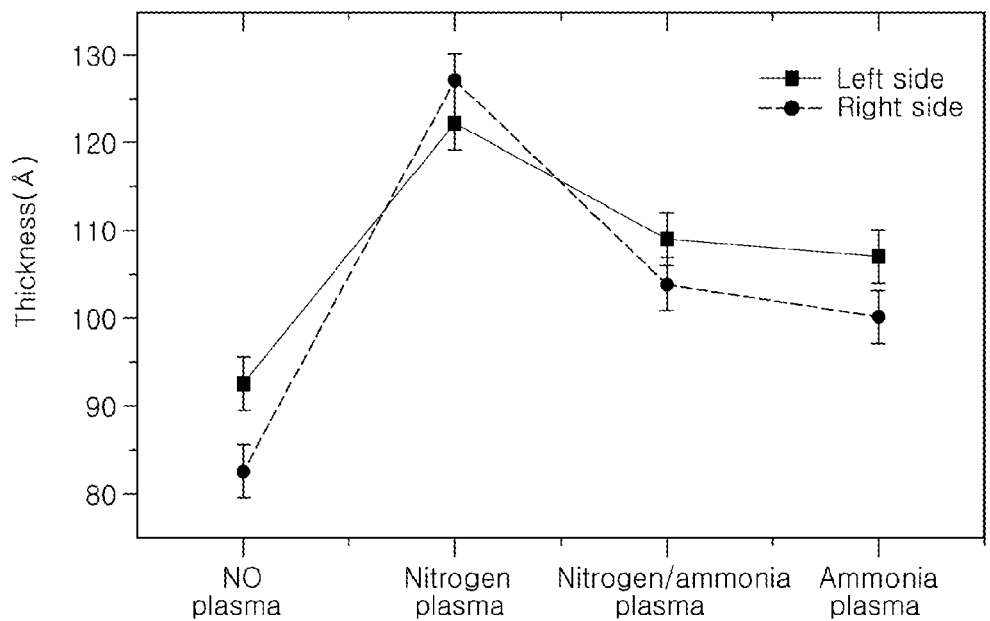
FIG. 7 is a graphical representation showing comparative differences between layer thicknesses of a protective structure on both sides of a phase change structure for various fabrication processes according to another embodiment.

FIG. 7 is a graphical representation showing comparative differences between layer thicknesses of a protective structure on both sides of a phase change structure for various fabrication processes described herein. In FIG. 7, when a protective layer is formed without the use of a plasma process, a thickness difference of about 10 Å to about 15 Å is observed. On the contrary, when conducting one of a nitrogen plasma treatment, ammonia/nitrogen plasma treatment, and ammonia plasma treatment, in accordance with the embodiments described herein, thickness differences of about 2 Å to about 3 Å, about 5 Å to about 6 Å, and about 7 Å to about 8 Å are observed, respectively. Accordingly, when conducting a plasma treatment, as in accordance with the embodiments described herein, step coverage characteristics can be substantially improved in comparison with a situation when no plasma treatment is performed.

Figure 8:
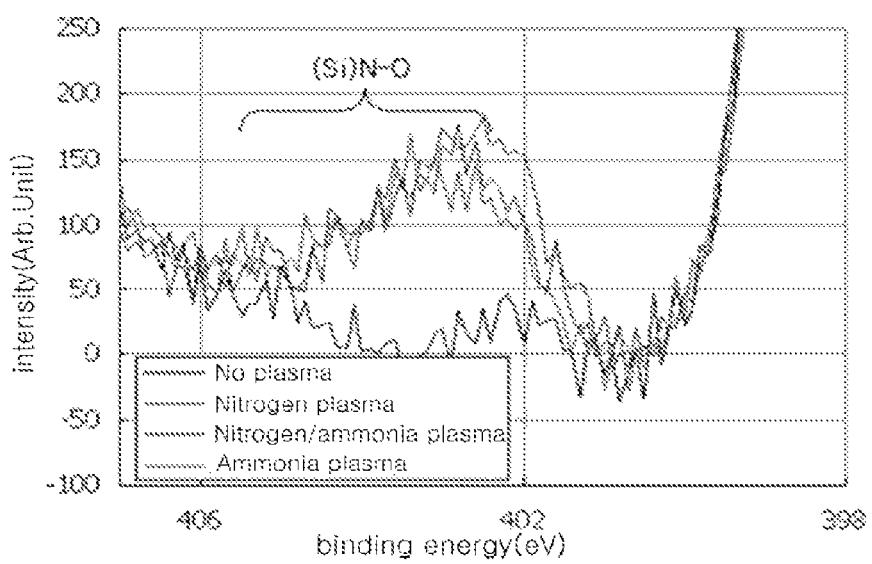
FIG. 8 is a graphical representation showing relative intensities of a protective structure for forming a dangling bond layer for various fabrication processes according to another embodiment.

FIG. 8 is a graphical representation showing relative intensities of a protective structure for forming a dangling bond layer for various fabrication processes according to another embodiment, and was obtained using auger electron spectroscopy (AES). In FIG. 8, using a plasma treatment results in the formation of dangling bonds, wherein the binding energy of the protective structure is significantly increased in comparison with the case of not conducting a plasma treatment. Thus, use of the plasma treatment results in the complete capping or encapsulating of the phase change structures as in accordance with the embodiments described herein.

As is apparent from the above description, in the embodiments described herein, a first protective layer, which has relatively low reactivity with a phase change material layer and can be deposited at a relatively low temperature, can be formed to directly contact the phase change material layer so as to cover the phase change material layer. An adsorption enhancement layer can be formed on the surface of the first protective layer, and a second protective layer, which has excellent reactivity and step coverage characteristics, can be formed on the adsorption enhancement layer, thereby forming protective structures. As a consequence, properties of the phase change material layer can be prevented from changing, and step coverage characteristics may be improved, whereby a subsequent gap fill process using an interlayer dielectric can be easily performed.

The embodiments described herein are not necessarily limited to the above-described embodiments. For example, while the first protective layer can include a silicon nitride layer, other substantial insulating layer(s) can be used as the first protective layer, as long as they can be deposited at a relatively low temperature and have reaction resistance to a phase change material layer. Furthermore, although the second protective layer can comprise a silicon oxide layer, other substantial insulating layer(s) can be used as the second protective layer, as long as they have excellent step coverage characteristics and excellent reactivity with dangling bonds.

In addition, although the atom adsorption enhancement layer comprises a dangling bond layer and is formed using a plasma treatment, other substantial methods can be employed, as long as they can induce dangling bonds.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A phase change memory device, comprising:
    a plurality of phase change structures, each having a phase change material layer, disposed on a semiconductor substrate;
    a first protective layer formed on surfaces of the plurality of phase change structures, wherein the first protective layer is in contact with the surfaces of the plurality of the phase change structures;
    an atom adsorption enhancement layer formed on a surface of the first protective layer, wherein the atom adsorption enhancement is in contact with a top surface of the first protective layer; and
    a second protective layer formed on a surface of the atom adsorption enhancement layer, wherein the second protective layer is in contact with a top surface of the atom adsorption enhancement layer.

2. The phase change memory device according to claim 1, wherein the first protective layer includes a low temperature insulating layer formed at a relatively low temperature within a range between about room temperature and about a phase change temperature of the phase change material layer.

3. The phase change memory device according to claim 2, wherein the low temperature insulating layer has reaction resistance to the phase change material layer.

4. The phase change memory device according to claim 3, wherein the first protective layer includes a low temperature silicon nitride layer.

5. The phase change memory device according to claim 1, wherein the atom adsorption enhancement layer includes a dangling bond layer.

6. The phase change memory device according to claim 1, wherein the second protective layer includes an insulating layer which has excellent step coverage and reactivity characteristics compared to the first protective layer.

7. The phase change memory device according to claim 6, wherein the second protective layer includes a silicon oxide layer.

8. The phase change memory device according to claim 1, wherein a thickness of the first protective layer is greater than a thickness of the second protective layer.

9. The phase change memory device according to claim 1, further comprising:
    a plurality of junction areas formed in the silicon substrate;
    a plurality of switching elements electrically, each contacted with one of the plurality of junction areas; and
    a plurality of bottom electrode contacts, each having a lower end contacting corresponding ones of the plurality of switching elements and an upper end contacting corresponding ones of the plurality of phase change structures.

10. The phase change memory device according to claim 1, wherein each of the plurality of phase change structures includes the phase change material layer, top electrodes formed on the phase change material layer, and a hard mask layer formed on the top electrodes.

11. A method for manufacturing a phase change memory device, comprising the steps of:
    forming a plurality of phase change structures, each including a phase change material layer, on a semiconductor substrate;

forming a first protective layer on the semiconductor substrate including the plurality of phase change structures, wherein the first protective layer is in contact with a top surface of the semiconductor substrate;

forming an atom adsorption enhancement layer on the first protective layer, wherein the atom adsorption enhancement layer is in contact with a top surface of the first protective layer; and forming a second protective layer on the atom adsorption enhancement layer to form a plurality of protective structures, wherein the second protective layer is in contact with a top surface of the atom adsorption enhancement layer.

12. The method according to claim 11, wherein the step of forming the first protective layer includes depositing a material having reaction resistance to the phase change material layer, at a temperature between about room temperature and about a phase change temperature of the phase change material layer.

13. The method according to claim 12, wherein the first protective layer includes a silicon nitride layer.

14. The method according to claim 12, wherein the first protective layer is formed using one of chemical vapor deposition, atomic layer deposition, and spin coating.

15. The method according to claim 12, wherein the first protective layer is formed by plasma enhanced chemical vapor deposition using an RF power within a range of 200 to 300 Watts.

16. The method according to claim 11, wherein the step of forming the atom adsorption enhancement layer includes plasma treatment of a surface of the first protective layer.

17. The method according to claim 16, wherein the plasma treatment is conducted under an atmosphere containing one of nitrogen, ammonia, and nitrogen/ammonia.

18. The method according to claim 16, wherein the steps of forming the first protective layer and the atom adsorption enhancement layer are implemented in-situ.

19. The method according to claim 16, wherein the steps of forming the first protective layer and the atom adsorption enhancement layer are implemented in the same chamber.

20. The method according to claim 19, wherein the step of forming the atom adsorption enhancement layer is implemented when a preset time elapses after the step of forming the first protective layer is implemented.

21. The method according to claim 11, wherein the second protective layer includes an insulating layer better step coverage and reactivity characteristics compared to the first protective layer.

22. The method according to claim 21, wherein the second protective layer includes a silicon oxide layer.

23. The method according to claim 22, wherein a thickness of the second protective layer is formed relatively thin when compared to the first protective layer.

24. The method according to claim 21, wherein the step of forming the second protective layer is implemented through plasma enhanced chemical vapor deposition by applying an RF power within a range of 500 to 650 Watts to generate a plasma.

25. The method according to claim 11, wherein, after the step of forming the second protective layer, the method further comprises the step of RF-etching regions of upper portions of sidewalls of the protective structures.

26. A method for manufacturing a phase change memory device, comprising the steps of:

forming a plurality of phase change structures, each including a phase change material layer, on a semiconductor substrate;

depositing a silicon nitride layer at a temperature between about room temperature and about a phase change temperature of the phase change material layer, on the semiconductor substrate including the plurality of phase change structures;

forming a dangling bond layer by plasma-treatment of a surface of the silicon nitride layer; and depositing a silicon oxide layer on the dangling bond layer to form a plurality of protective structures.

27. A method for manufacturing a phase change memory device, comprising the steps of:

Forming a plurality of phase change structures, each including a phase change material layer, on a semiconductor substrate;

Forming a first protective layer on the semiconductor substrate including the plurality of phase change structures, wherein the first protective layer includes a silicon nitride layer;

Forming an atom adsorption enhancement layer on the first protective layer; and

Forming a second protective layer on the atom adsorption enhancement layer to form a plurality of protective structures.

28. The method according to claim 27, wherein the step of forming the first protective layer includes depositing a material having reaction resistance to the phase change material layer, at a temperature between about room temperature and about a phase change temperature of the phase change material layer.

29. The method according to claim 28, wherein the first protective layer is formed using one of chemical vapor deposition, atomic layer deposition, and spin coating.

30. The method according to claim 28, wherein the first protective layer is formed by plasma enhanced chemical vapor deposition using an RF power within a range of 200 to 300 Watts.

31. The method according to claim 27, wherein the step of forming the atom adsorption enhancement layer includes plasma treatment of a surface of the first protective layer.

32. The method according to claim 31, therein the plasma treatment is conducted under an atmosphere containing one of nitrogen, ammonia, and nitrogen/ammonia.

33. The method according to claim 31, wherein the steps of forming the first protective layer and the atom adsorption enhancement layer are implemented in-situ.

34. The method according to claim 31, wherein the step of forming the first protective layer and the atom adsorption enhancement layer are implemented in the same chamber.

35. The method according to claim 34, wherein the step of forming the atom adsorption enhancement layer is implemented when a preset time elapses after the step of forming the first protective layer is implemented.

36. The method according to claim 27, wherein the second protective layer includes an insulating layer better step coverage and reactivity characteristics compared to the first protective layer.

37. The method according to claim 36, wherein the second protective layer includes silicon oxide layer.

38. The method according to claim 37, wherein a thickness of the second protective layer is formed relatively thin when compared to the first protective layer.

39. The method according to claim 36, wherein the step of forming the second protective layer is implemented through plasma enhanced chemical vapor deposition by applying an RF power within a range of 500 to 650 Watts to generate a plasma.

40. The method according to claim 27, wherein after the step of forming the second protective layer, the method further comprises the step of RF-etching regions of upper portions of sidewalls of the protective structures.

* * * * *